(12) United States Patent  (10) Patent No.: US 6,759,912 B2
Yamagishi et al.  (45) Date of Patent: Jul. 6, 2004

(54) PHASE LOCKED LOOP

(75) Inventors: Akihiro Yamagishi, Yokohama (JP); Tsuneo Tsukahara, Ebina (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/254,973

(22) Filed: Sep. 26, 2002

(65) Prior Publication Data

US 2003/0146794 A1 Aug. 7, 2003

(30) Foreign Application Priority Data

Feb. 7, 2002 (JP) ........................................ 2002-030565

(51) Int. Cl.[7] .............................................. H03L 7/00
(52) U.S. Cl. ............................ 331/17; 331/25; 327/157
(58) Field of Search ...................... 331/17, 25; 375/374, 375/376; 327/157, 148, 536

(56) References Cited

U.S. PATENT DOCUMENTS

| | | | |
|---|---|---|---|
| 5,675,292 A | 10/1997 | McCune, Jr. ................. | 331/17 |
| 5,847,614 A * | 12/1998 | Gilbert et al. ................. | 331/14 |
| 6,580,329 B2 * | 6/2003 | Sander ........................ | 331/17 |
| 2002/0132595 A1 * | 9/2002 | Kokubo ....................... | 455/119 |
| 2003/0042985 A1 * | 3/2003 | Shibahara et al. ............ | 331/17 |

FOREIGN PATENT DOCUMENTS

| | | |
|---|---|---|
| EP | 0 376 847 | 7/1990 |
| EP | 0 840 456 | 5/1998 |
| EP | 1 006 662 | 6/2000 |

* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

A phase-locked loop comprises a phase detector receiving an externally supplied reference signal and a feedback signal, a charge pump connected to an output of the phase detector, a loop filter configured to extract a low-frequency component from an output of the charge pump, and a voltage controlled oscillator having an input connected to the output of the loop filter and an output connected to the feedback signal supplied to the phase detector. The charge pump comprises a first switch that controls outputting a positive current based on the output of the phase detector, a second switch that controls outputting a negative current based on the output of the phase detector, a third switch connected between the first switch and the second switch to control an output to the loop filter, and a switching control signal input terminal that receives a switching control signal for controlling a switching operation of the third switch.

7 Claims, 9 Drawing Sheets

PHASE LOCKED LOOP

BACKGROUND OF THE INVENTION

1. Field of the Invention

The present invention relates to a phase-locked loop, and more particularly to an improved phase-locked loop used as a local oscillator in a radio communication system, which is capable of maintaining the control voltage of the voltage controlled oscillator (VCO) constant during the open-loop operation, while coping with the tendency of reducing a source voltage.

2. Description of Related Art

Phase-locked loops (PLL) are used as local oscillators in various communication systems. For example, a PLL is incorporated in a front-end transceiver of a radio communication system to synchronize a local oscillation signal with an externally supplied reference signal.

FIG. 1A illustrates a conventional PLL 100 used as a local oscillator in a radio communication system. PLL 100 comprises a phase detector 110, a charge pump 120, a loop filter 130, a voltage controlled oscillator (VCO) 140, and a programmable divider 150, in which an output from the VCO 140 is fed back to the phase detector 110 to define a closed loop. The phase detector 110 compares the phase of the feedback clock supplied from the VCO 140 with a reference clock externally supplied, and outputs a signal in proportion to the phase difference. The charge pump 120 and the loop filter 130 extract a low-frequency component (i.e., a differential component) from the output signal of the phase detector 110, and supply the extracted low-frequency component to the VCO 140. The VCO 140 varies its oscillating frequency based on the output from the loop filter 130.

In general, the PLL used in a radio communication system has an FSK (frequency shift keying) modulating function, in addition to the above-described local oscillating function. FSK modulation is a function for shifting the output frequency between two or more prescribed values in accordance with, for example, multiple channels. In this case, the output frequency is locked to a carrier frequency under the closed loop, and then, the loop of the PLL 100 is opened. Under the open loop, a modulation signal is applied directly to the voltage controlled oscillator (VCO 140) from an external circuit (such as a baseband processing circuit connected to the front-end transceiver) to generate frequency-shifted waves.

In this manner, a PLL ordinarily operates in the closed-loop mode, functioning as a feedback circuit; however, it works in the open-loop mode when carrying out, for example, FSK modulation. The simplest way for opening the loop of the PLL 100 is turning off the charge pump 120.

FIG. 1B illustrates a conventional charge pump 120 used in the PLL 100. The charge pump 120 can be realized as a simple structure shown in FIG. 1B through a CMOS process. The charge pump 120 comprises a switch (PMOS transistor M3) 123 that is turned on by application of an up signal, and a switch (NMOS transistor M4) 124 that is turned on by application of a down signal.

In operation of the conventional charge pump 120 under the closed loop, a feedback signal input to the terminal fp of the phase detector 110 is compared with a reference signal input to the terminal fr. If the phase of the reference signal is ahead of that of the feedback signal, the phase detector 110 outputs a zero voltage or a negative voltage (which is referred to as "LOW") from its output terminal pu, which causes the PMOS transistor (M3) 123 of the charge pump 120 to be turned on. Upon turning on the PMOS transistor (M3) 123, charge is accumulated in the capacitor of the loop filter 130. Assuming that the control characteristic of the VCO 140 (FIG. 1A) has a positive polarity, the control voltage of the VCO 140 increases in accordance with the accumulation of charge in the loop filter 130. Since the output frequency of the VCO 140 increases, the phase of the feed back signal becomes into consistent with that of the reference signal. On the other hand, if the phase of the reference signal input to the terminal fr is behind the feedback signal, LOW is output from the terminal pd to turn on the NMOS transistor (M4) 124 of the charge pump 120. Then, the charge is taken out of the loop filter 130, and the control voltage of the VCO 140 lowers. As a result, the output frequency of the VCO 140 decreases, and the phase of the feedback signal becomes into consistent with that of the reference signal.

Next, to open the loop of the PLL 100 for FSK modulation or other operations, the charge pump 120 is turned off. Both PMOS transistor 123 and NMOS transistor 124 of the charge pump 120 are turned off forcibly by an external control signal, regardless of the output of the phase detector 110. In the off state of the transistors 123 and 124, charge does not flow in and out of the capacitor of the loop filter 130. Consequently, the control voltage of the VCO 140 is maintained constant, and the output frequency of the VCO 140 becomes constant.

In this state, a modulation signal is applied directly to the input terminal vc of the VCO 140 from an adder of the external circuit (e.g., the baseband processing circuit). The output frequency of the VCO 140 changes in response to the change in the voltage level of the VCO 140, and a prescribed value of FSK modulation waves can be obtained.

In actual use of the charge pump 120 shown in FIG. 1B, the current becomes unbalanced. To overcome this problem, a current supply is used, or alternatively, the switches are differentiated to increase the speed of response of the charge pump 120.

By the way, as time goes by, the design rule of the CMOS process becomes finer and finer, and the power source voltage is lowered along with the continued miniaturization of the circuit design. An attempt is also made to reduce the threshold value of a transistor for the purpose of increasing the operation speed of a logic circuit. However, if the threshold voltage is set lower, off-leakage of the MOS transistor becomes large. For example, when PMOS transistor 123 and NMOS transistor 124 are turned off in the charge pump 120 shown in FIG. 1B to open the loop, the charge accumulated in the capacity of the loop filter 130 fluctuates due to off-leakage of the transistors 123 and 124, and consequently, the control voltage of the VCO 140 abruptly varies.

FIG. 2 illustrates a simulation result of the voltage drift of the loop filter due to off-leakage that occurs when PMOS transistor 123 and NMOS transistor 124 are turned off in the conventional charge pump 120 of the PLL 100. As time passes, the amount of voltage change increases, and the voltage varies by 0.15V or more in 100 $\mu$s. This phenomenon prevents the PLL 100 from maintaining the transmission frequency constant under the open loop, and FSK modulation can not be carried out appropriately.

To overcome this problem, transistors with a relatively long channel-length may be used to reduce the off-leakage from PMOS transistor (M3) and NMOS transistor (M4). However, the size of the transistors M3 and M4 that are connected to the output of the charge pump 120 becomes large, and another problem arises, that is, the speed of response of the charge pump 120 slows down.

SUMMARY OF THE INVENTION

The present invention was conceived to overcome the above-described problems in the prior art, and it is an object of the invention to provide a phase-locked loop that can maintain the control voltage of the voltage control oscillator (VCO) constant under the open loop, while coping with the trend of reducing the power source voltage along with the miniaturization of the CMOS process.

To achieve the object, a third switch is inserted before the output of the charge pump to control switching between the open loop and the closed loop of the PLL. The third switch can be realized as, for example, a MOS transistor.

To be more precise, a phase-locked loop (PLL) comprises a phase detector receiving an externally supplied reference clock and a feedback clock; a charge pump connected to the output of the phase detector; a loop filter extracting a low-frequency component from the output of the charge pump; and a voltage controlled oscillator (VCO) having an input connected to the output of the loop filter and an output connected to the feedback clock supplied to the phase detector, in which the charge pump comprises a first switch that controls outputting a negative current based on the output of the phase detector, a second switch that controls outputting a positive current based on the output of the phase detector, a third switch connected between the first switch and the second switch to control an output to the loop filter, and an input terminal receiving a switching control signal for controlling opening and closing of the third switch.

With this arrangement, a long-channel transistor with little leakage current can be used as the third switch, while using high-speed short-channel transistors for the first and second switches. Consequently, the leakage current flowing during the open-loop operation can be reduced, without deteriorating the speed of response, and the control voltage of the voltage controlled oscillator (VCO) can be maintained constant. In addition, by inserting the third switch (i.e., the resistance) before the output of the charge pump, fluctuation of electric current flowing into and out of the loop filter during the open-loop operation can be reduced. This also results in a constant control voltage of the voltage controlled oscillator (VCO).

In an embodiment, the input terminal receiving the switching control signal is connected directly to the third switch to control the opening and closing of the loop, regardless with the ON/OFF states of the first and second switches. This arrangement can reduce undesirable off-leakage, without slowing down the speed of response.

In another embodiment, the charge pump further comprises a control circuit connected before the first and second switches to control the ON/OFF operations of the first, second, and third switches. In this case, the input terminal for receiving the switching control signal is connected to the control circuit. To open the loop of the PLL, the control circuit controls the first, second, and third switches so that the third switch is turned off, while turning on the first and second switches.

With this arrangement, a substantially equal amount of electric current flows through the first switch and the second switch during the open-loop operation, and the electric potential between the first switch and the second switch stays at or near equal to one-half of the control voltage of the voltage controlled oscillator (VCO). Consequently, the off-leak current can be further reduced in the open loop.

BRIRF DESCRIPTION OF THE DRAWINGS

Other objects, features, and advantages of the invention will become more apparent from the following detailed description when read in conjunction with the accompanying drawings, in which FIG. 1A is a schematic block diagram of a conventional phase-locked loop, and FIG. 1B illustrates the structures of the charge pump and the loop filter shown in FIG. 1A;

DETAILED DESCRIPTION OF THE PREFERRED EMBODIMENTS

Figure 3:
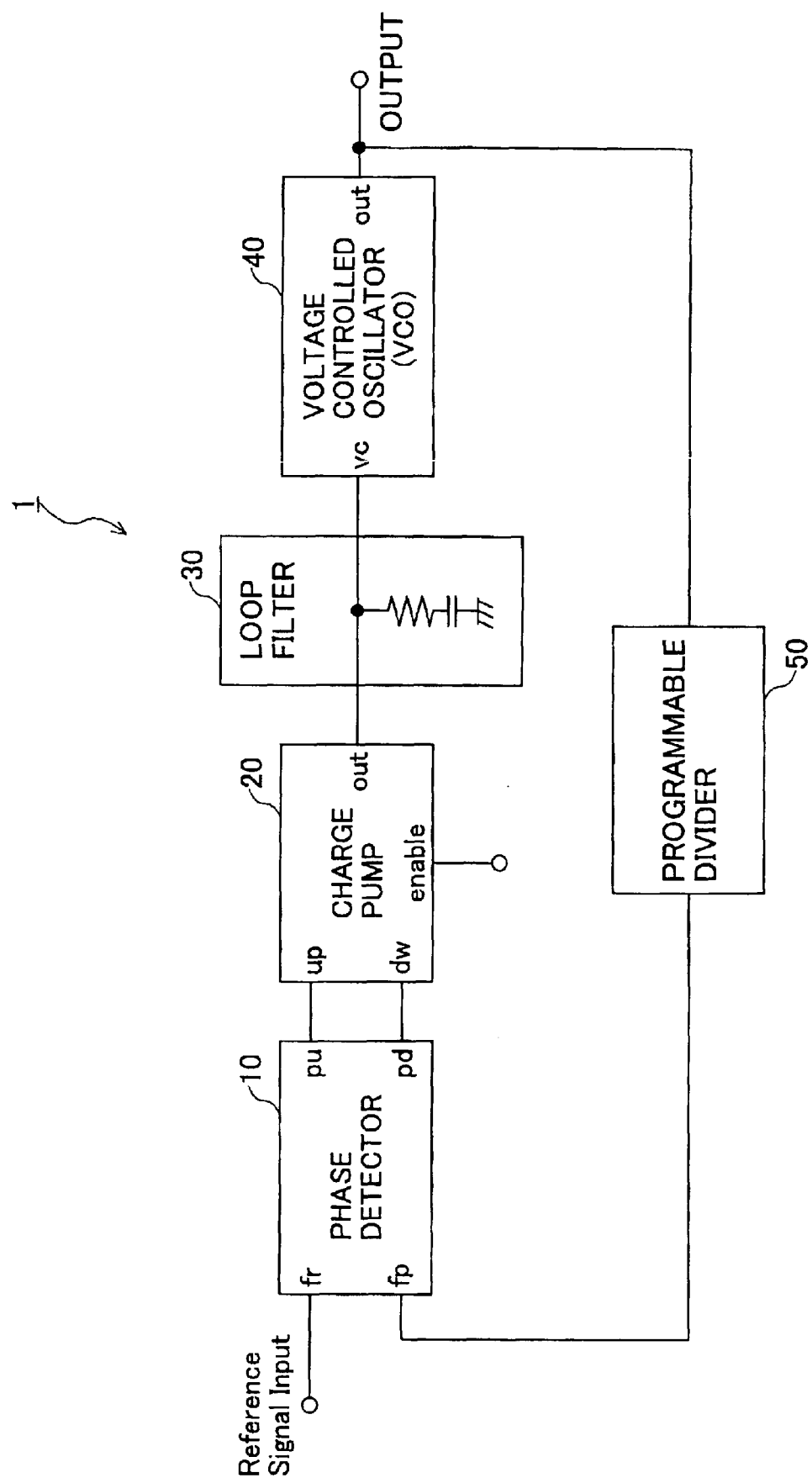
FIG. 3 is a schematic block diagram of the phase-locked loop according to embodiments of the present invention.
Figure 4:
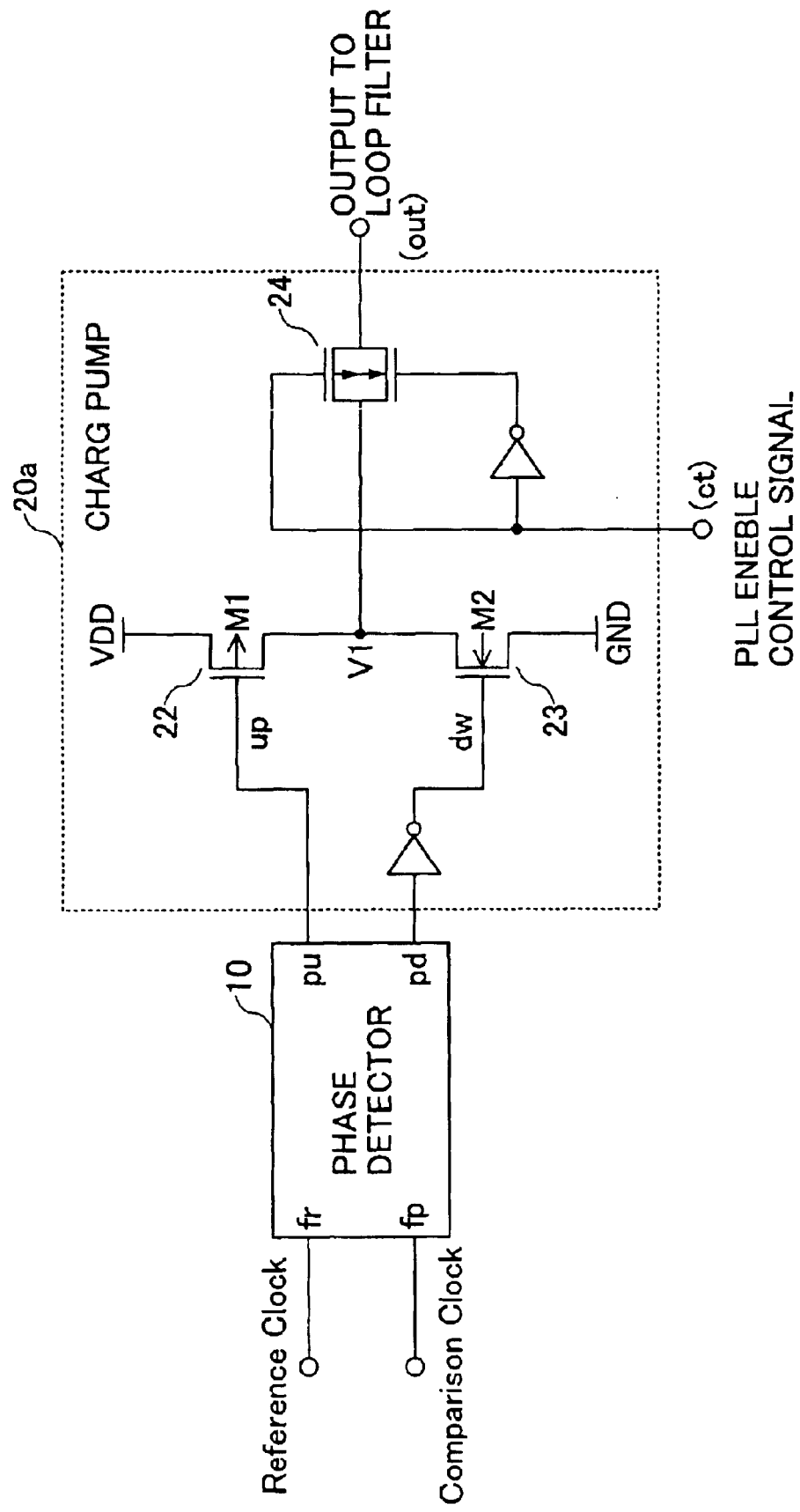
FIG. 4 illustrates the structure of a charge pump used in the phase-locked loop shown in FIG. 3 according to the first embodiment of the invention.

FIG. 3 illustrates, in a block diagram, a phase-locked loop (PLL) 1 according to the invention, and FIG. 4 illustrates an example of the charge pump 20a used in the phase-locked loop (PLL) 1 shown in FIG. 3 according to the first embodiment of the invention.

The phase-locked loop (PLL) 1 comprises a phase detector 10, a charge pump 20 connected to the phase detector 10, a loop filter 30 connected to the charge pump 20, and a voltage controlled oscillator (VCO) 40 connected to the loop filter 30. The output of the voltage controlled oscillator (VCO) 40 is fed back to the phase detector 10 to define a loop. The charge pump 20 has an input terminal that receives a switching control signal "enable" for controlling opening and closing the loop.

Figure 5:
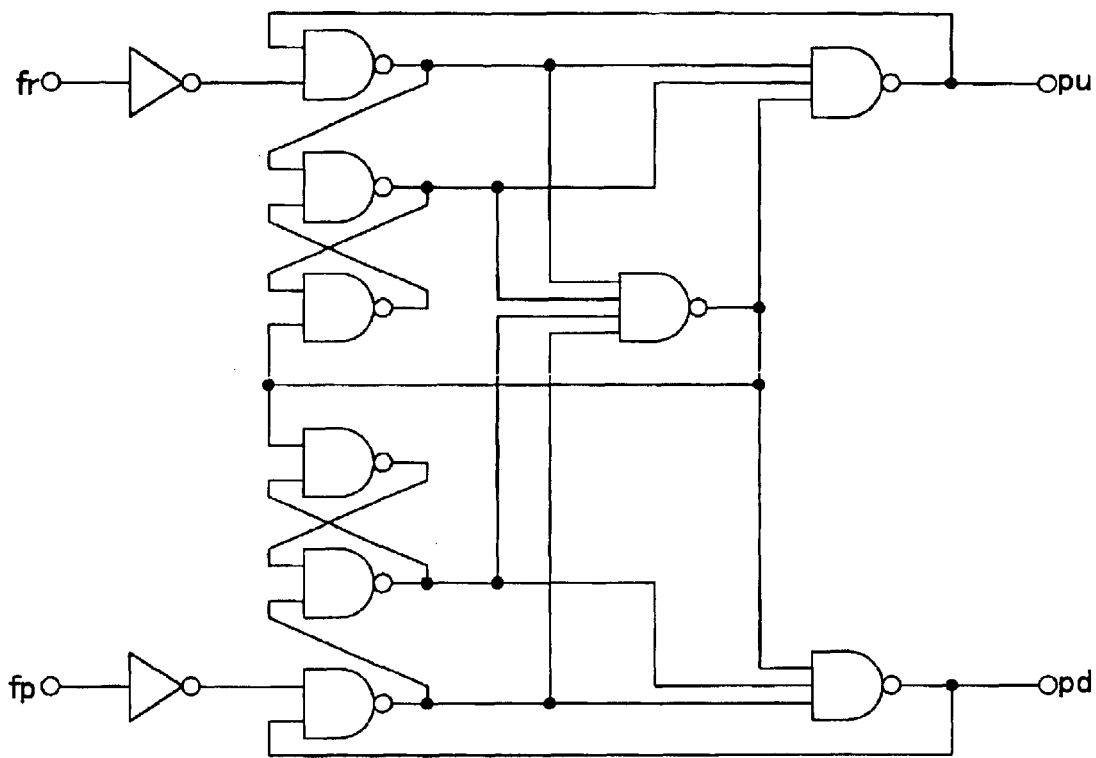
FIG. 5 illustrates an example of the phase detector shown in FIG. 4.

As illustrated in FIG. 4, the input terminal fr of the phase detector 10 receives a reference clock, which is externally supplied and used in the PLL 1, while the input terminal fp receives an output of the VCO 40, or its frequency-divided signal, which is to be compared with the reference clock. The phase detector 10 has a known structure shown in FIG. 5. If the phase of the feedback clock (or the comparison clock) supplied from the VCO 40 is behind that of the reference clock, an up signal is output from the output terminal pu of the phase detector 10 in order to raise the control voltage of the VCO 40 to increase the output frequency. On the other hand, if the phase of the feedback clock supplied from the VCO 40 is ahead of that of the reference clock, then a down signal is output from the output terminal pd of the phase detector 10 in order to reduce control voltage of the VCO 40 to decrease the output frequency.

The charge pump 20a has a first MOS transistor (M1) 22 receiving the up signal at its gate, a second MOS transistor (M2) 23 receiving the inversion of the output from the terminal pd of the phase detector at its gate, and a third switch 24 connected to the drain voltage V1 of the first and second MOS transistors 22 and 23. The MOS transistor (M1) 22 functions as a first switch for controlling outputting a positive current, and the MOS transistor (M2) 23 functions as a second switch for controlling outputting a negative current.

In the first embodiment, an input terminal (ct) receiving a PLL enable signal is connected directly to the third switch 24 to control the opening and closing of the loop of the PLL 1. Thus, the PLL enable signal is applied to the gate of the third switch 24.

To cause the PLL 1 to operate in the closed loop, a low level (Low) representing logical "0" is input, as the PLL enable control signal, to the input terminal (ct). Then, the third switch 23 is turned on, which causes the PLL to operate in the ordinary closed loop.

To causes the PLL 1 to operate in the open loop, a high level (Hi) representing logical "1" is input, as the PLL enable control signal, to the input terminal (ct) to turn off the third switch 24. Since the third switch 24 is connected to the loop filter 30, the charge accumulated in the loop filter 30 does not change as long as the third switch is turned off. Consequently, the control voltage of the VCO 40 can be maintained constant during the open-loop operation.

Figure 6:
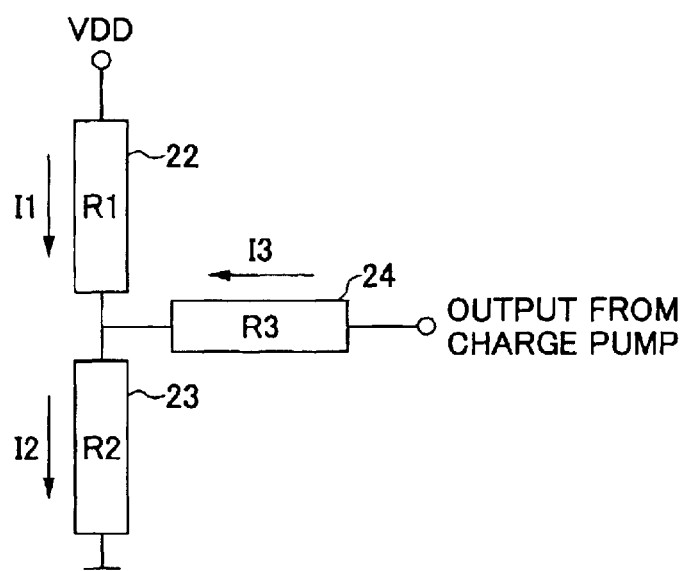
FIG. 6 is a diagram for explaining how the electric current flowing in and out between the charge pump and the loop filter is reduced in the structure shown in FIG. 4.

FIG. 6 is a diagram illustrating the first switch (PMOS transistor M1) 22, the second switch (NMOS transistor M2) 23, and the third switch 24 of the charge pump 20a as a resistor circuit. The resistances of the first, second and third switches 22, 23, 24 are denoted as R1, R2 and R3, and electric currents flowing through R1, R2 and R3 are denoted as I1, I2 and I3. If the voltage at the output terminal of the charge pump 20a is VDD/2, then electric current I3 flowing through the third switch 24 is expressed by equation (1).

$$I3 = \frac{R1 - R2}{2(R1 \cdot R2 + R2 \cdot R3 + R3 \cdot R1)} \cdot VDD \qquad (1)$$

Figure 1A:
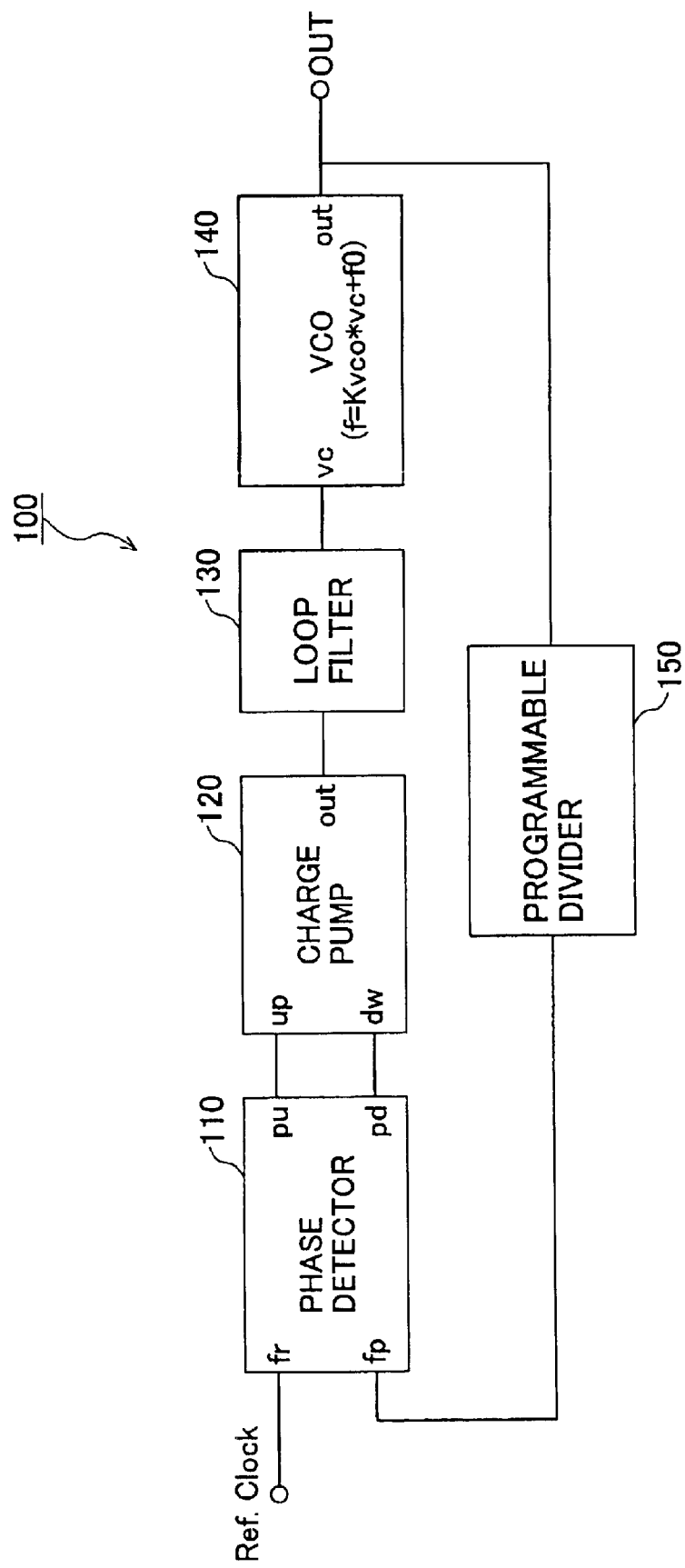
Figure 1B:
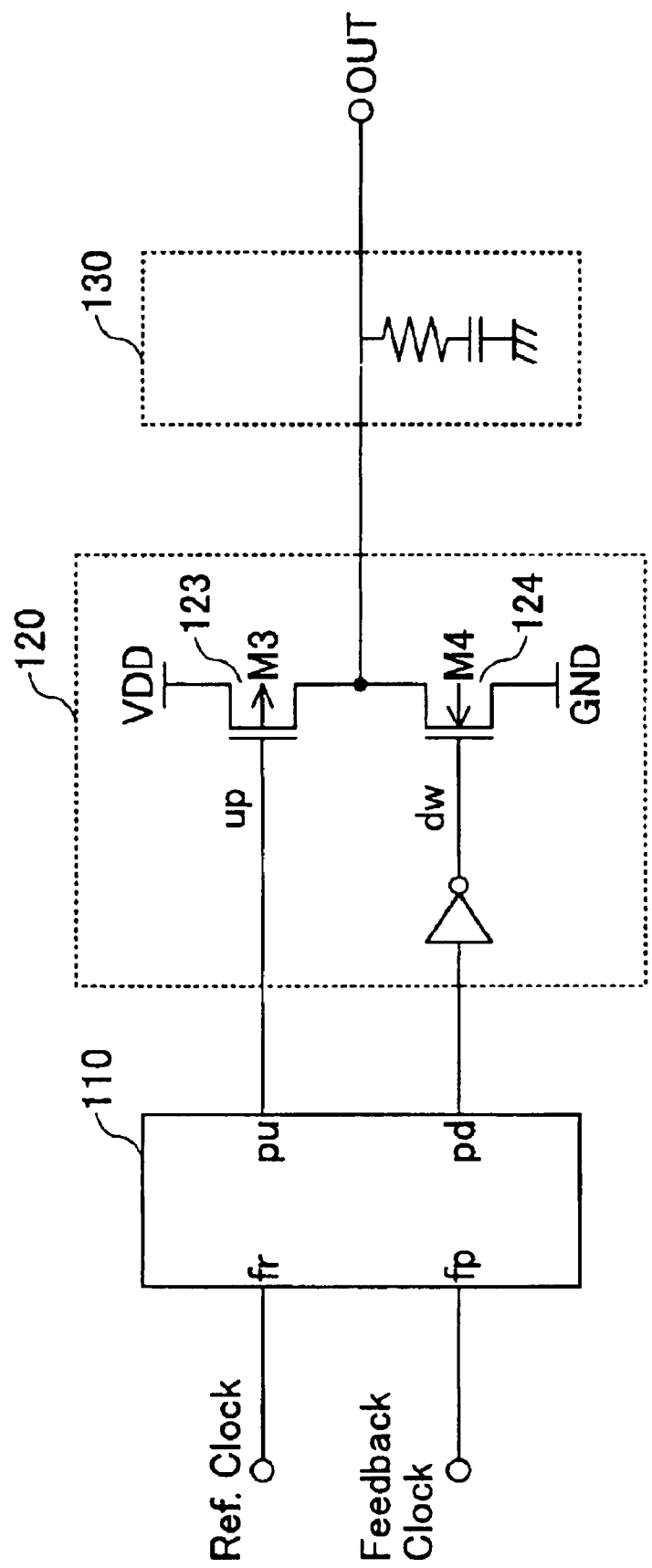
Figure 2:
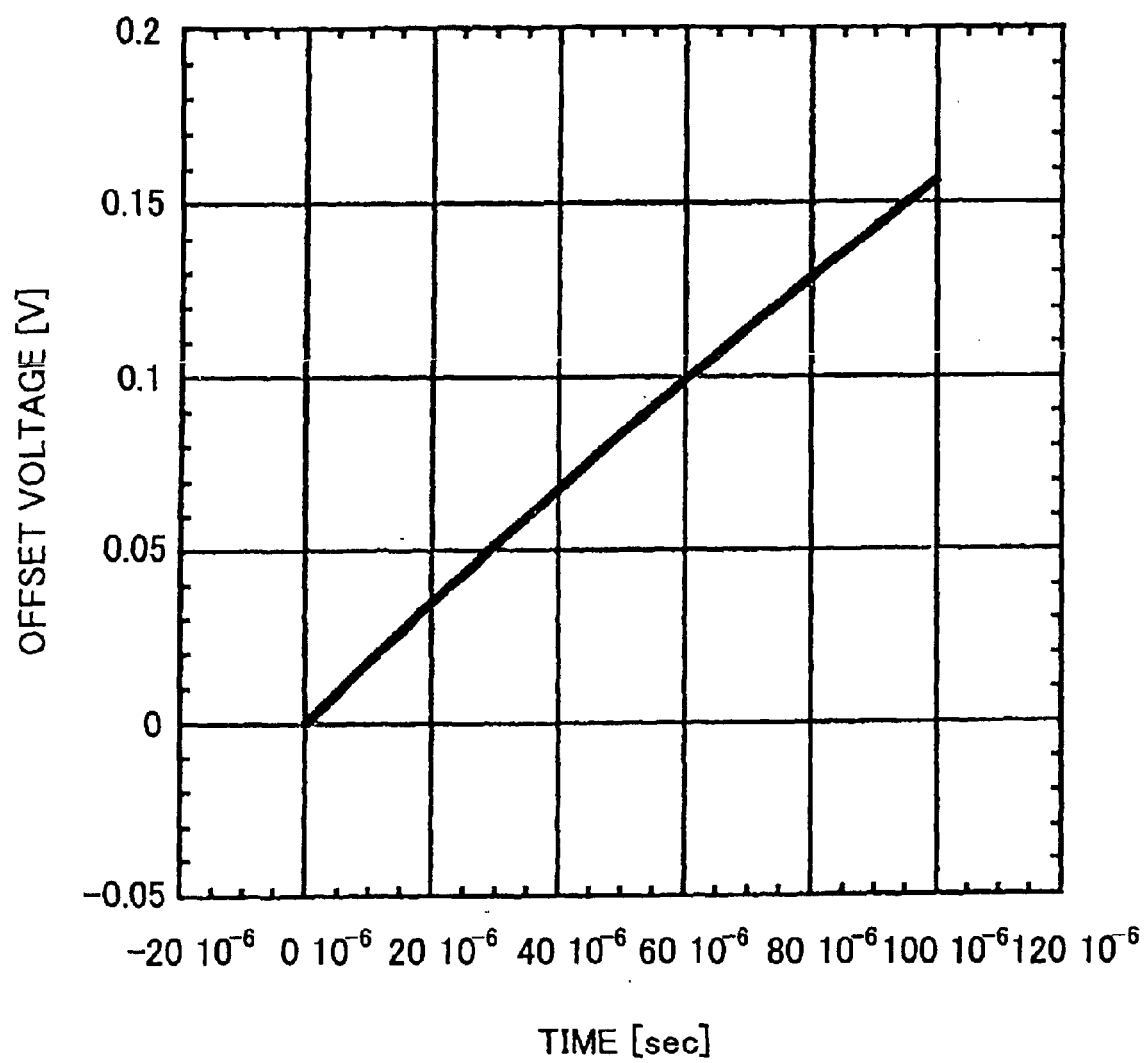
FIG. 2 is a graph of the simulation result indicating the voltage drift occurring in the conventional phase-locked loop shown in FIG. 1A, where the vertical axis represents offset voltage and the horizontal axis represents time.

In the conventional charge pump 120 shown in FIG. 1A, R3 is zero, and therefore, I3 in the conventional charge pump becomes $$I3 = \frac{R1 - R2}{2 \cdot R1 \cdot R2} \cdot VDD. \qquad (2)$$

This means that electric current proportional to the resistance difference between R1 and R2 is produced as I3, which flows into and out of the loop filter in the conventional charge pump.

On the contrary, electric current I3 expressed by equation (1), which is generated in the charge pump of the first embodiment shown in FIG. 4, is much smaller than the electric current I3 of the conventional charge pump expressed by equation (2) because R1, R2, and R3 take positive values.

By inserting the third switch 24 before the output of the charge pump 20, and by directly controlling the ON/OFF operation of the third switch 24 using a switching control signal, leakage current produced during turning off the third switch 24 is greatly reduced. At the same time, the speed of response of the first and second switches 22 and 23 can be maintained high.

In this state, the charge accumulated in the loop filter 30 becomes almost constant with the substantially reduced I3,
and the control voltage of the VCO 40 also becomes constant in the open loop. As a result, the PLL 1 can maintain the transmission frequency stably during the open-loop operation.

Figure 7:
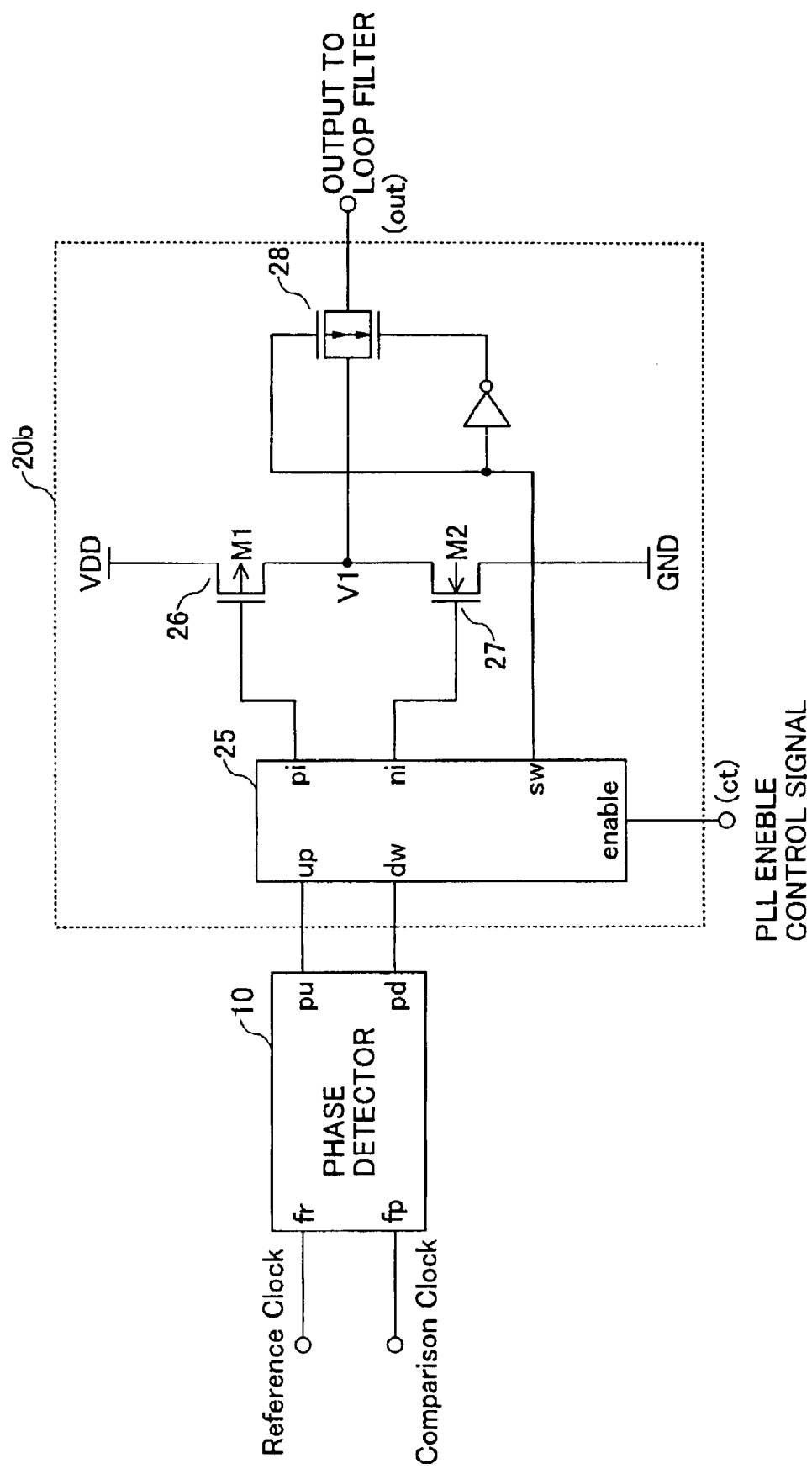
FIG. 7 illustrates the structure of a charge pump used in the phase-locked loop shown in FIG. 3 according to the second embodiment of the invention.

FIG. 7 illustrates a charge pump 20b used in the PLL 1 according to the second embodiment of the invention. The charge pump 20b comprises a first transistor (M1) 26 that controls outputting a positive current, a second transistor (M2) 27 that controls outputting a negative current, a third switch 28 connected to the drain voltage V1 of the first and second transistors 26 and 27, and a control circuit 25 that controls the ON/OFF operations of the first transistor (M1) 26, the second transistor (M2) 27, and the third switch 28. In the second embodiment, the input terminal (ct) receiving a PLL enable control signal is connected to the control circuit 25, and the opening and closing of the third switch 28 is controlled by the control circuit 25.

In order to cause the PLL 1 having the circuit structure shown in FIG. 7 to operate in the closed loop, "LOW" is input, as the PLL enable control signal, to the input terminal (ct) of the control circuit 25. The "LOW" signal is supplied to the third switch 28 via the node sw of the control circuit 25, and an inserted signal is applied to the gate of the third switch 28 to turn on the third switch 28. A signal supplied from the output terminal pu of the phase detector 10 is applied to the gate of the PMOS transistor (i.e., the first transistor M1) 26, and an inversion of the output signal from the output terminal pd of the phase detector 10 is applied to the gate of the NMOS transistor (i.e., the second transistor M2) 27. In this state, an ordinary closed-loop operation is carried out.

To open the loop of the PLL 1, "Hi" is input, as the PLL enable control signal, to the input terminal (ct) of the control circuit 25 to turn off the third transistor 28. At this time, both the first transistor (M1) 26 and the second transistor (M2) 27, which are connected to the outputs from the phase detector 10, are turned on for the purpose of effectively reducing the off-leakage. The details of reducing the leakage current will be explained below.

Figure 8:
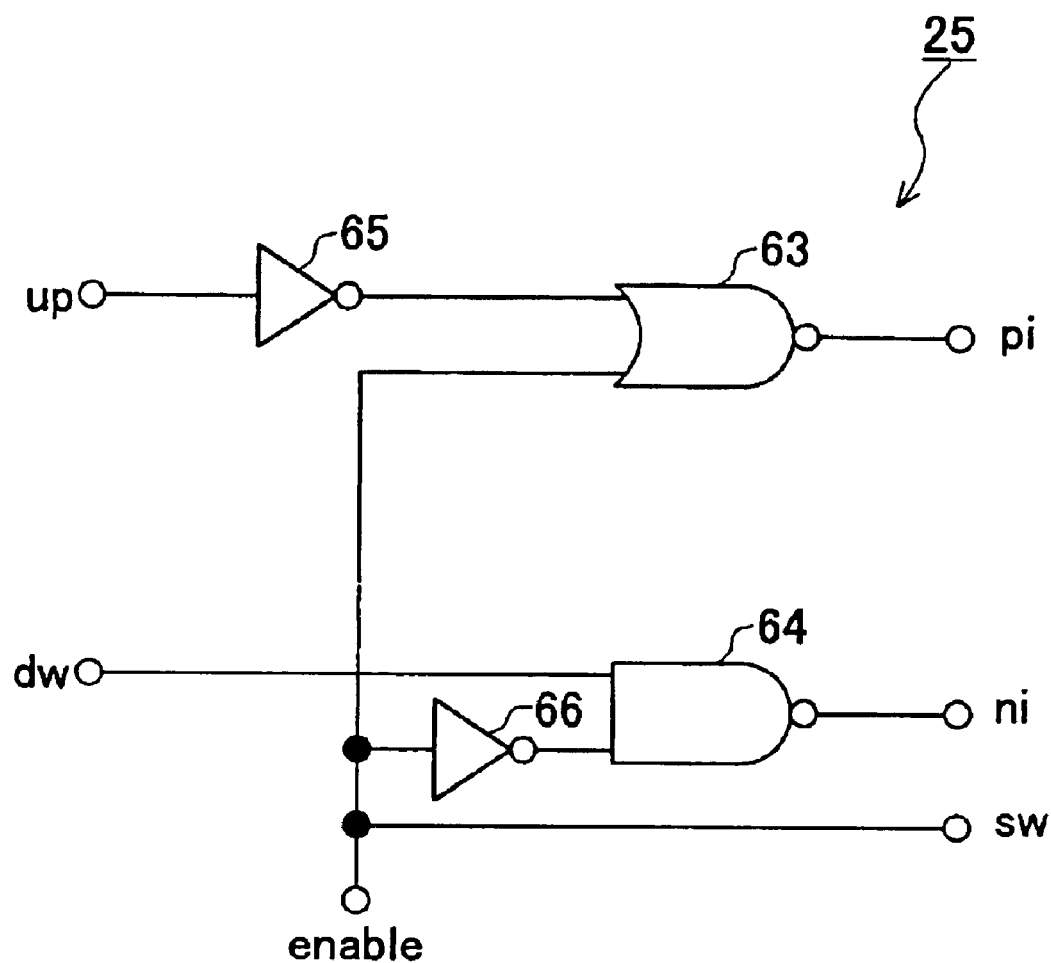
FIG. 8 illustrates the structure of the control circuit used in the charge pump shown in FIG. 7.

FIG. 8 illustrates an example of the control circuit 25 shown in FIG. 7. The control circuit 25 illustrated in FIG. 8 comprises an inverting element 65 connected to the output terminal pu of the phase detector 10, a NOR gate 63 receiving the output of the inverting element 65 and the PLL enable control signal, an inverting element 66 receiving the PLL enable signal, and a NAND gate 64 receiving the output of the inverting element 66 and the down signal from the output terminal pd of the phase detector 10.

In order to turn off the third switch 28 to open the loop, "Hi" is input, as the PLL enable control signal, to the input terminal (ct). The NOR gate 63 outputs logical "0" when at least one of the inputs is logical "1", and therefore, "Low" is applied to the gate of the PMOS transistor (i.e., the first transistor M1) 26 via the node pi of the control circuit 25. Accordingly, the first transistor 26 is turned on. This "Hi" signal is inverted by the inverting element 66 prior to being input to the NAND gate 64. The NAND gate 64 outputs logical "1" when at least one of the inputs is logical "0", and therefore, "Hi" is applied to the gate of the NMOS transistor (i.e., the second transistor M2) 27 via the node ni of the control circuit 25. Consequently, the second transistor 27 is also turned on.

In this state, a substantially equal amount of electric current flows through the first transistor (M1) 26 and the second transistor (M2) 27, and the drain voltage V1 stays at about one-half the value of the source voltage VDD, which is substantially equal to the voltage at the output of the charge pump 20*b*. Consequently, the leakage current flowing through the third switch 28 can be further reduced. This can be explained in a numerical manner.

Electric current I3 flowing through the third switch 28 is expressed by equation (1), as has been described in the first embodiment.

$$I3 = \frac{R1 - R2}{2(R1 \cdot R2 + R2 \cdot R3 + R3 \cdot R1)} \cdot VDD \quad (1)$$

If R1 and R2 are written as R1=(1+a)R, and R2=R using a coefficient "a", then equation (1) is modified as $$I3 = \frac{a}{2\{(1+a) \cdot R + (2+a) \cdot R3\}} \cdot VDD. \quad (3)$$

With the structure shown in FIG. 4 representing the charge pump 20*a* of the first embodiment, the ON/OFF operation of the third switch 24 is controlled independently, and accordingly, the first transistor (M1) 22 and the second transistor (M2) 23 are in the OFF state most of the time during the open-loop operation. In general, the difference in off resistance between the PMOS transistor (M1) 22 and the NMOS transistor (M2) 23 is large. If the coefficient "a" takes a value a1, then the relation a=a1>>1 is held. In this case, equation (3) is approximated to equation (4).

$$I3_1 = \frac{1}{2 \cdot (R_{off} + R3)} \cdot VDD \quad (4)$$

where $R_{off}$ denotes the off resistance of the first and second transistors 22 and 23.

On the other hand, both the first transistor (M1) 26 and the second transistor (M2) 27 are turned on during the open-loop operation, and therefore, the relation R=$R_{on}$<<R3 stands, where $R_{on}$ denotes the ON resistance of the first and second transistors 26 and 27. In this case, equation (3) can be approximated to equation (5).

$$I3_2 = \frac{a2}{2 \cdot (2 + a2) \cdot R3} \cdot VDD \quad (5)$$

where a2 denotes a value of coeffieicent "a" when the first transistor 26 and the second transistor 27 are both in the ON state in the second embodiment.

Comparing $I3_1$ obtained in equation (4) with $I3_2$ obtained in equation (5), the condition that satisfies $I3_2 < I3_1$ is $$R_{off} < \frac{2}{a2} \cdot R3. \quad (6)$$

where $R_{off}$ is the off resistance of the first transistor (M1) 22 and the second transistor (M2) 23 in the structure of the first embodiment, and R3 is the off resistance of the third switch 28 of the second embodiment. Since the third switch 28 can be realized as a long-channel transistor, R3 is equal to or greater than $R_{off}$. In addition, since a2 represents the difference in ON resistance between the first transistor (M1) 26 and the second transistor (M2) 27, a2 is smaller than 1 (a2<1). Accordingly, condition of inequality (6) is satisfied. This proves that $I3_2$ appearing at the output of the charge pump 20*b* of the second embodiment is smaller than $I3_1$ appearing at the output of the charge pump 20*a* of the first embodiment, and that the influence on the loop filter 30 can be further reduced. Even if a charge pump with a low threshold voltage is used in the PLL 1, the control voltage of the voltage controlled oscillator (VCO) 40 is maintained constant in a stable manner during the open-loop operation.

Figure 9:
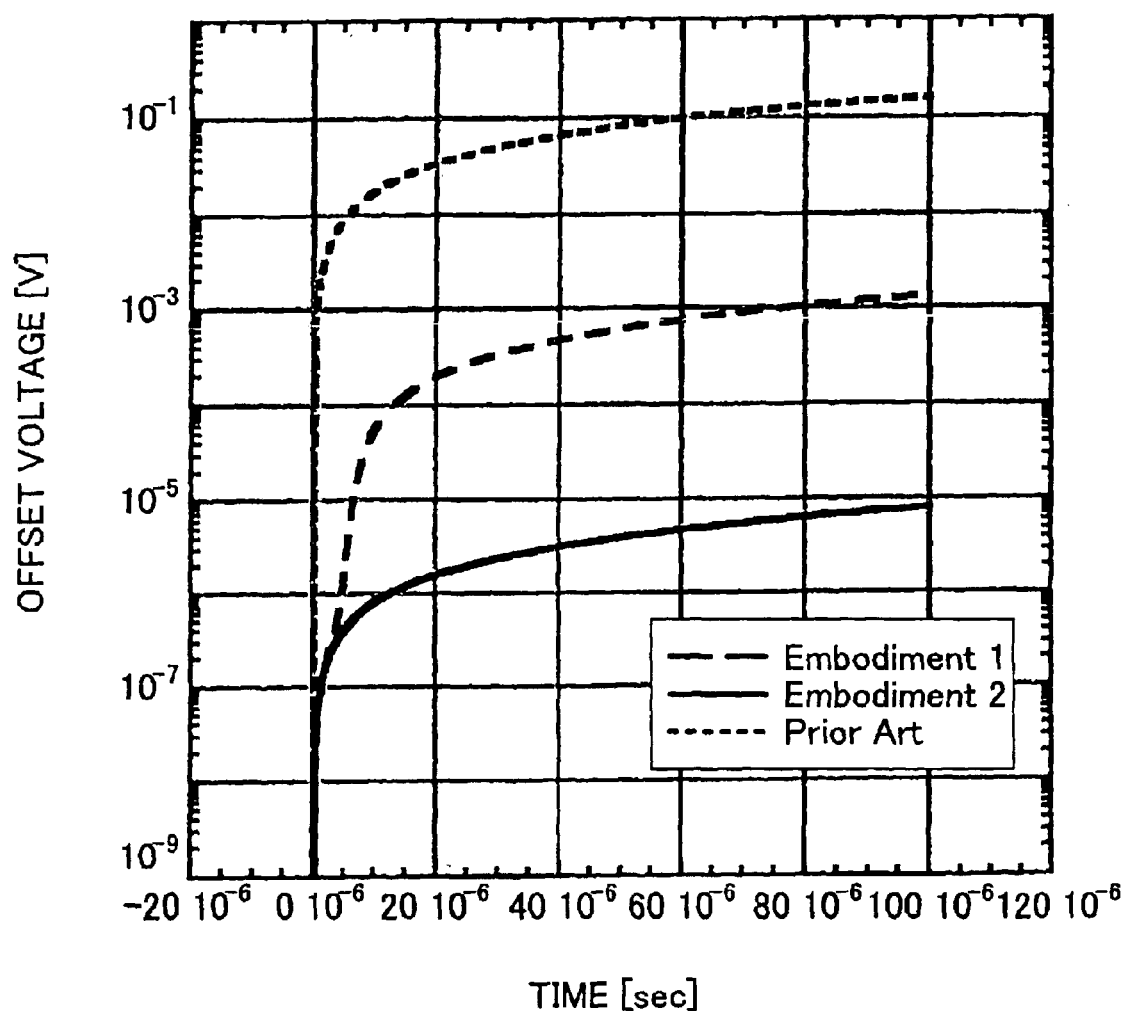
FIG. 9 is a graph of the simulation result showing the effect of reducing the voltage drift in the phase-locked loop according to the first and second embodiments, where the vertical axis represents the logarithmic value of offset voltage and the horizontal axis represents time.

FIG. 9 is a graph showing the effect of the present invention for reducing the voltage drift of the PLL 1, where the horizontal axis represents time and the vertical axis represents the time-variable offset voltage expressed in logarithmic form. In the graph, the dashed line indicates the offset voltage of the conventional charge pump, the long dashed line indicates the offset voltage of the PLL of the first embodiment, and the solid line indicates the offset voltage of the PLL of the second embodiment.

With the conventional charge pump, the offset voltage greatly increases as time passes due to the difference in off-leakage between the first (PMOS) transistor M3 and the second (NMOS) transistor M4. In contrast, using the charge pump according to the first embodiment can reduce the voltage fluctuation by order of magnitude two, as compared with the conventional circuit. The structure of the second embodiment can further reduce the voltage fluctuation by order of magnitude two, as compared with the circuit of the first embodiment.

In conclusion, the present invention realizes a phase-locked loop (PLL) that is capable of efficiently reducing the leakage current from the charge pump during the open-loop operation, even if the charge pump is comprised of CMOS transistors which are likely to produce more leakage current as the CMOS process becomes finer, and as the threshold voltage is set lower.

Although the present invention has been described based on the preferred embodiments, the invention is not limited to these examples, but includes various modifications and substitutions that can be made by a person skilled in the art, without departing from the scope of the present invention. For example, the control circuit used in the second embodiment to control opening and closing the loop is realized by a combination of the NOR gate and the NAD gate. However, an arbitrary circuitry that can turn on the first and second transistors during the open-loop operation may be employed as the control circuit.

This patent application is based on and claims the benefit of the earlier filing date of Japanese patent application No. 2002-30565 filed Feb. 7, 2002, the entire contents of which are hereby incorporated by reference.

What is claimed is:

1. A phase-locked loop comprising:

a phase detector receiving an externally supplied reference signal and a feedback signal;

a charge pump connected to an output of the phase detector;

a loop filter configured to extract a low-frequency component from an output of the charge pump; and a voltage controlled oscillator having an input connected to the output of the loop filter and an output connected to the feedback signal supplied to the phase detector, wherein the charge pump comprises:

a first switch configured to control outputting a positive current based on the output of the phase detector;

a second switch configured to control outputting a negative current based on the output of the phase detector;

a third switch connected between the first switch and the second switch to control an output to the loop filter;

a switching control signal input terminal configured to receive a switching control signal for controlling a switching operation of the third switch; and a control circuit connected to the switching control signal input terminal and configured to control switching operations of the first switch, the second switch, and the third switch of the charge pump.

2. The phase-locked loop according to claim 1, wherein the switching control signal input terminal is connected to the third switch, and the phase-locked loop is opened by turning off the third switch through application of the switching control signal.

3. The phase-locked loop according to claim 1, wherein the control circuit turns off the third switch, while turning on the first switch and the second switch, during an open-loop operation of the phase-locked loop.

4. The phase-locked loop according to claim 1, wherein the feedback signal is the output of the voltage controlled oscillator or a frequency-divided signal of the output of the voltage controlled oscillator.

5. A charge pump used in a phase-locked loop, comprising:

a first switch connected to a first output of a phase detector of the phase-locked loop and configured to control outputting a positive current based on the first output;

a second switch connected to a second output of the phase detector and configured to control outputting a negative current based on the second output;

a third switch connected between the first switch and the second switch to control an output of the charge pump;

a switching control signal input terminal configured to receive a switching control signal for controlling a switching operation of the third switch; and a control circuit configured to control switching operations of the first switch, the second switch, and the third switch, wherein the switching control signal input terminal is connected to the control circuit.

6. The charge pump according to claim 5, wherein the switching control signal input terminal is connected to the third switch, and the third switch is turned off upon application of the switching control signal to make the phase-locked loop open.

7. The charge pump according to claim 5, wherein the control circuit turns off the third switch, while turning on the first switch and the second switch, during an open-loop operation of the phase-locked loop.

\* \* \* \* \*